(12) United States Patent
Dauler et al.

(10) Patent No.: US 7,638,751 B2
(45) Date of Patent: Dec. 29, 2009

(54) MULTI-ELEMENT OPTICAL DETECTORS WITH SUB-WAVELENGTH GAPS

(75) Inventors: Eric A. Dauler, Charlestown, MA (US); Andrew J. Kerman, Somerville, MA (US); Karl K. Berggren, Arlington, MA (US); Vikas Anant, Somerville, MA (US); Joel K. W. Yang, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 12/118,187

(22) Filed: May 9, 2008

(65) Prior Publication Data

US 2009/0050790 A1 Feb. 26, 2009

Related U.S. Application Data

(60) Provisional application No. 60/916,914, filed on May 9, 2007.

(51) Int. Cl.
*G01J 1/44* (2006.01)
*H01L 27/18* (2006.01)

(52) U.S. Cl. .............................. 250/214 R; 250/336.2; 250/338.1; 313/103 R; 313/103 CM (58) Field of Classification Search ............. 250/214 R, 250/207, 336.2, 338.1; 313/103 R, 103 CM
See application file for complete search history.

(56) References Cited

U.S. PATENT DOCUMENTS 6,812,464 B1 11/2004 Sobolewski et al.
7,049,593 B2 5/2006 Sobolewski et al.
2002/0158188 A1* 10/2002 Jordan .................... 250/214 R

OTHER PUBLICATIONS

Smirnov et al., "Ultrathin NbN film superconducting single-photon detector array" Journal of Physics: Conference Series 61, 2007, pp. 1081-1085, Apr. 1, 2007.
Dauler et al., "1.25-Gbit/s photon-counting optical communications using a two-element superconducting nanowire single photon detector" Advanced Photon Counting Techniques, Proc. of SPIE, vol. 6372, pp. 637212-1-637212-8, Oct. 25, 2006.
Rosfjord et al., "Nanowire Single-photon detector with an integrated optical cavity and anti-reflection coating" Optics Express, vol. 14, No. 2, pp. 527-534, Jan. 23, 2006.
Kerman et al., "Constriction-limited detection efficiency of superconducting nanowire single-photon detectors" Applied Physics Letters, 90, 2007 American Institute of Physics, pp. 101110-1-101110-3, Mar. 5, 2007.

* cited by examiner

*Primary Examiner*—Seung C Sohn
(74) *Attorney, Agent, or Firm*—Gauthier & Connors LLP (57) ABSTRACT

A multi-element optical detector includes a plurality of optical detector elements capable of producing an output signal having information about the state of an incident electromagnetic radiation as a function of time. An active region includes a photosensitive region of one of the optical detector elements separated in part or in whole from the photosensitive region of at least one other optical detector element by a distance less than the wavelength of the electromagnetic radiation that the optical detector elements are being used to detect.

18 Claims, 6 Drawing Sheets

MULTI-ELEMENT OPTICAL DETECTORS WITH SUB-WAVELENGTH GAPS

PRIORITY INFORMATION

This application claims priority from provisional application Ser. No. 60/916,914 filed May 9, 2007, which is incorporated herein by reference in its entirety.

This invention was made with government support awarded by the United States Air Force under Grant No. FA8721-05-C-0002. The government has certain rights in the invention.

BACKGROUND OF THE INVENTION

The invention relates to the field of optical detectors, and in particular to a multi-element superconducting nanowire single photon detector (MESNSPD) that includes multiple independently-biased superconducting nanowire single photon detector (SNSPD) elements that form a continuous active area.

Optical detectors allow a measurement of the variation in the power or energy of the incident electromagnetic radiation with time. Some optical detectors can also provide information about other properties of the incoming electromagnetic radiation including its polarization, wavelength or equivalently frequency, positional variation as well as others. It is possible to use optical detectors that can not individually measure these other properties of the incident radiation to extract such information by externally directing the incoming radiation preferentially between multiple optical detectors. The response of the independent detectors can then be used to extract the desired information. While this approach has the advantage of allowing the desired information to be obtained using a wider range of optical detector technologies, potential disadvantages include: sensitivity losses, gaps in the measurement of continuously variable properties such as wavelength or positional variation, the size of such a detector, and the complexity of the coupling optics.

SUMMARY OF THE INVENTION

According to one aspect of the invention, there is provided a multi-element optical detector. The multi-element optical detector includes a plurality of optical detector elements capable of producing an output signal having information about the state of an incident electromagnetic radiation as a function of time. An active region includes a photosensitive region of one of the optical detector elements separated in part or in whole from the photosensitive region of at least one other optical detector element by a distance less than the wavelength of the electromagnetic radiation that the optical detector elements are being used to detect.

According to another aspect of the invention, there is provided a method of forming a multi-element optical detector. The method includes forming a plurality of optical detector elements capable of producing an output signal having information about the state of an incident electromagnetic radiation as a function of time. Also, the method includes forming an active region having a photosensitive region of one of the optical detector elements separated in part or in whole from the photosensitive region of at least one other optical detector element by a distance less than the wavelength of the electromagnetic radiation that the optical detector elements are being used to detect.

DETAILED DESCRIPTION OF THE INVENTION

The invention involves an approach for improving the capabilities of optical detectors that can be fabricated with gaps between independent elements smaller than the wavelength of the detected electromagnetic radiation. This technology has been reduced to practice for the case of a superconducting single photon detector, but is applicable to any detector of electromagnetic radiation which can be fabricated with sub-wavelength gaps between elements.

Figure 1A:
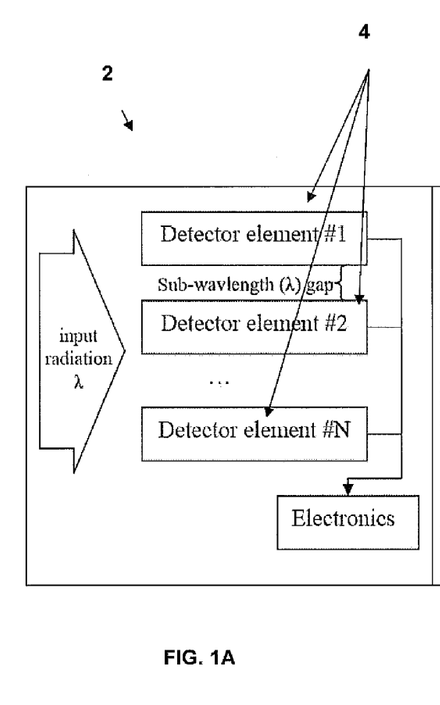
FIGS. 1A-1B are schematic diagrams showing illustrative embodiments of the invention.

FIG. 1A shows the inventive multi-element detector 2. The multi-element detector 2 includes more than one detector element 4 with the photosensitive region 6 of one detector element separated in part or in whole from at least one other detector element's photosensitive region 6 by a distance less than the wavelength of the electromagnetic radiation that the elements are being used to detect. A detector element is defined as a device capable of producing an output signal having information about the state of incident electromagnetic radiation as a function of time. Multiple detector elements 4 are distinguished from a single element detector by all of the following: i) the presence of multiple photosensitive regions which are electrically connected only through non-photosensitive electrical elements including, but not limited to, wires, resistors, capacitors, junctions, and transistors; (ii) the ability, were appropriate electronics in place, to operate the individual elements independently, whether or not such electronics are actually in place to individually address the elements (iii) the presence of electronics which serves to combine the electrical output of the individual detector elements to provide more information about the detected electromagnetic radiation as compared to a single element The multiple detector elements 4 can serve several purposes. For example, the incident electromagnetic radiation may be preferentially directed toward a specific element based on its spatial mode, spectral mode, temporal mode, polarization and/or some other property of the state of the electromagnetic radiation to be detected. In this example, the identity of the element which produces a discernable output signal would provide information about the state of the electromagnetic radiation by which the electromagnetic radiation was preferentially directed to that element. In another example, the incident electromagnetic radiation may be directed toward multiple elements, without intended preference. In this case, the radiation from a single or multiple states may be detected with a higher bandwidth, at a higher peak intensity or over a larger dynamic range (photon-number-resolution in the case of a single-photon-sensitive detector) relative to a single element.

The invention is distinguished from other implementations of multiple independent detectors by the fact the individual detector elements are separated by less than the wavelength of the detected electromagnetic radiation. When the separation distance is less than the wavelength, the need for an optical element to direct the electromagnetic radiation away from the gaps between detector elements can be eliminated. Additionally, the size of the sub-wavelength gap between detector elements may be selected in order to maximize the absorptivity of the detector elements, such as minimizing the reflection and transmission of the detector elements by, for example, interference effects created at the interfaces between the detector material and surrounding materials and layers. Furthermore, this invention allows for the possibility of designing the individual detector elements to be smaller than the total area over which the electromagnetic radiation is detected in cases where the bandwidth or other properties of the detector can be improved by reducing its size, but the total optical active area must be maintained.

Although many photodetectors are composed of regions of various materials which may include non-photosensivity regions separating photosensitive regions, this invention only applies to multiple photosensitive regions that can be operated independently. Furthermore, electronics must be in place to combine the output of isolated photosensitive regions in a way that provides more information about the incident electromagnetic radiation than a single photosensitive region. This electronics does not necessarily need to provide the capability to individually address the photosensitive regions, nor does it need to provide all of the information that would be extracted if the elements were individually addressed.

Figure 1B:
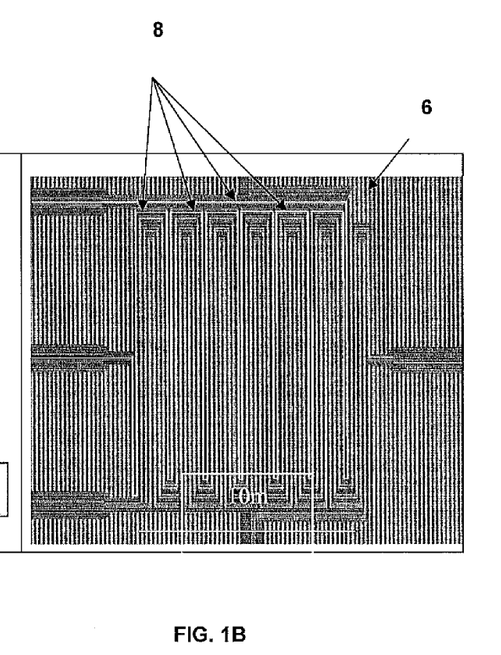

Finally, the multiple detector elements 4 can be arranged to compose the total active area in any configuration suitable for the intended function. For example, the detector elements 4 can be arranged such that the detector elements are not intertwined, as shown in FIG. 1A, which is particularly suitable for cases where the optical input is directed toward specific elements in order to extract information about its state. As another example, the detector elements 8 may be intertwined, which is particularly suitable for cases when the optical input is not intended to be directed to a specific element, as shown in FIG. 1B.

The invention is applicable to optical detector technologies that can be fabricated with sub-wavelength gaps between elements that can benefit from the performance gains possible with multiple elements and that benefit from eliminating the loss associated with larger gaps between elements. The need for sub-wavelength gaps is likely to make this technology a poor match for most existing semiconductor-based optical detectors. However, one suitable detector technology, as pursued in the reduction to practice, are superconducting single photon detectors. These detectors are composed of highly-sub-wavelength features that can be easily divided into multiple elements. Furthermore, the performance, and in particular the loss, of single photon detection technology is critically important to many applications and justifies the complexity of adding multiple elements. Superconducting single photon detectors are a relatively new, and as such have not yet been commercialized, so it is difficult to judge the economic potential of this invention. However, recently developed superconducting single photon detectors have been demonstrated with better performance in virtually every regard than competing, commercialized single-photon technologies, so it is likely they could capture a significant portion of this market once commercialized.

The multi-element invention described here provides a relatively low-cost, low-complexity way of extending the performance advantage of superconducting single photon detectors in many ways that are important to single photon applications, including higher-speed/larger active areas, photon-number-resolution, and the ability to extract spatial or spectral information. Finally, as nanotechnology progresses and other optical detector technologies are developed that utilize nanowires or quantum dots, it is likely that this invention will be applicable to those technologies as well.

Using the invention one can develop photon counters, which provide the ultimate sensitivity in optical detection, many applications require additional information about the state of the optical radiation, including spatial, spectral and photon-number resolution that most photon counters do not provide. One of two approaches can be taken in order to obtain this information: the optical signal can be spread across a large array of single-photon detectors, so that the information is extracted from the number and position of the detectors that fire, or a photon counting technology can be selected that allows the information to be extracted from a single detector's output signal.

The spatial and spectral resolution from a large array can be much better than from a single detector because the resolution of the array is limited only by the number of elements and the optics used to couple the light, not by noise in the detection process or analog readout electronics. Furthermore, an array is more flexible than a single detector, because the same array and readout electronics can be combined with any combination of: (1) imaging optics that provide spatial information, (2) a diffraction grating that provides spectral information, or (3) an optic that spreads the beam across multiple elements to provide photon number resolution and higher counting rates. Finally, the array can be composed of detectors that do not individually resolve information about all of these properties of light, which allows a detector technology to instead be selected to provide high-detection efficiency, low dark count rate, or excellent timing resolution.

However, there are also disadvantages to using arrays of photon counting detectors. First, there is typically an optical coupling loss associated with a microlens array or non-unity fill factor. Second, some photon counters require a significant amount of discrete electronics or cannot be fabricated on a single wafer, so arrays may be expensive or bulky. Third, many problems faced by single detectors, such as fabrication yield and dark counts, are multiplied when arrays of photon counters are needed. Finally, there are additional challenges that arise in arrays, such as crosstalk between elements and providing readout for each detector in a large array.

A multi-element superconducting nanowire single photon detector (MESNSPD) approach alleviates many of these disadvantages, particularly when the input optics are configured so that the MESNSPD provides photon number resolution and higher counting rates. The first disadvantage of photon counting arrays discussed above, the additional optical loss associated with coupling light into the array versus a single detector, is eliminated by the MESNSPD design. The MESNSPD differs from conventional arrays of photon counters because the gaps between elements are the same as the gaps that would be present in single element detector: the elements are lithographically patterned such that the combined active area is indistinguishable optically from that of a single-element detector.

This uniformity eliminates the coupling loss associated with a microlens array or non-unity fill factor. Second, a packaged MESNSPD is unlikely to be large or expensive because hundreds of superconducting nanowire single photon detectors (SNSPDs) can be fabricated on a single chip and the electronics required to operate a superconducting nanowire single photon detector (SNSPD) are simple because SNSPDs do not require an external reset circuit. Third, although fabrication yield and the scaling of dark counts will need to be addressed, the MESNSPD design provides a unique opportunity to alleviate these challenges. If the optical beam is to be spread across multiple elements to provide higher counting rates or photon-number resolution, the MESNSPD elements can be fabricated with active areas smaller than a focused optical spot. Using smaller, contiguous elements that are illuminated by a single, tightly focused beam provides several advantages compared to larger, isolated elements: smaller SNSPDs can have faster reset times, because this time is limited primarily by the kinetic inductance of the nanowire, and smaller elements are also likely to have lower dark count rates and higher fabrication yields.

The final drawbacks to photon counting arrays mentioned above are the challenges associated with scaling to large array sizes and the potential for interactions between array elements; these drawbacks and the advantages of the MESNSPD design are addressed in the remainder of this paper. Some of the challenges associated with scaling the MESNSPD approach to large array sizes are discussed briefly in the next section, in which the design and fabrication of a two-element MESNSPD is also presented. A series of experiments to study the interactions between the elements of a two-element SNSPD are discussed in the third section. Measurements of the noise count rate, the detection efficiency and the timing jitter showed no interaction between the two detector elements due to detection events in the adjacent element.

The performance improvements provided by the MESNSPD approach are demonstrated. It is shown that even a two-element SNSPD can be useful if light is spread evenly across both elements: the two-element SNSPD can simultaneously resolve more than one photon and also has roughly four times the maximum counting rate of a single SNSPD with the same active area. This configuration is useful for Hanbury Brown-Twiss measurements and applications requiring very high counting rates, such as optical communications. Although the two-element SNSPD used was biased and read out using discrete electronics, future efforts to integrate these functions on chip could make this approach useful for arrays with more elements designed for applications such as spectroscopy, laser radar and quantum optics.

Superconducting nanowire single photon detectors (SNSPDs) are composed of a thin, narrow superconducting wire that is biased slightly below its critical current. The absorption of a photon in the wire depletes the number of superconducting carriers in a small region, reducing the critical current density such that the critical current is exceeded and a small length of wire becomes resistive. In order for this resistive region to form as a result of the absorption of single infrared photons, the wire dimensions must be small: approximately 4 nm thick and 100 nm wide NbN wires are used both in this work and previous work. It has been shown previously that the detection efficiency of SNSPDs with these dimensions can be as high as 57% at 1.55 μm wavelength after the addition of an optical cavity and anti-reflection coating.

Figure 2A:
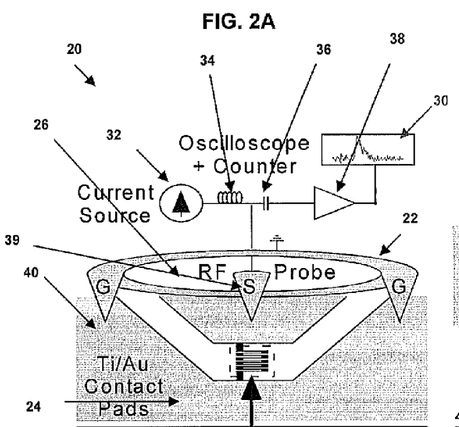
FIGS. 2A-2D are schematic diagram showing illustrative embodiments of a multi-element superconducting nanowire single photon detector (MESNSPD)
Figure 2B:
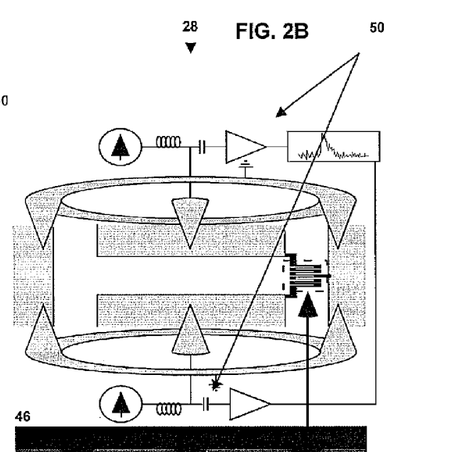
Figure 2C:
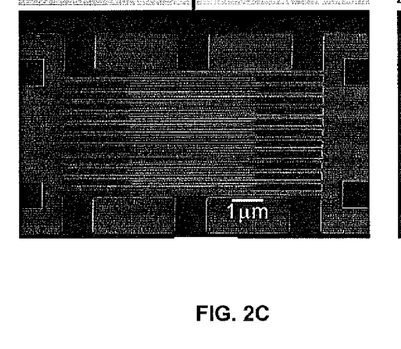
Figure 2D:
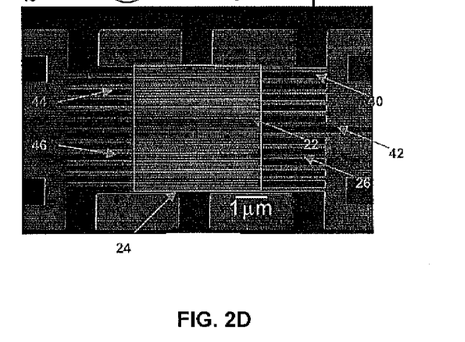

In order to increase the active area over which a photon can be absorbed using, the wire 22 is typically written as a boustrophedonic pattern (a meander with straight segments), as shown for a typical SNSPD in FIG. 2A. The gaps 26 between wires are also typically 100 nm, highly sub-wavelength for IR photons, resulting in an absorption that can be described by an effective index of refraction, but does not limit the detection efficiency to the ratio of area covered by wire. The active area 24, which is composed of straight segments of wire that are connected (shorted) on alternate ends 40, is thus a continuous optical element at the IR wavelengths of interest. An oscilloscope and/or counter 30 is used to measure electromagnetic radiation coming from the active area 24. The readout includes a current source 32, an inductor 34, a capacitor 36, and an amplifier 38. FIG. 2C is an SEM diagram of the structure shown in FIG. 2A. The identical active area exists if an extra lead 42 is added from one of the connections between nanowire segments 44, 46, allowing the active area 24 to be split into two separate wires, as shown in FIG. 2D. A second readout 48 is used to provide electromagnetic measurements associated with the wire 46. Similarly, more leads can be added in this fashion in order to split the active area into more elements. The maximum number of elements in a MESNSPD is limited by the need to connect contact pads to each element.

Ideally, the multiple detector elements composing a MESNSPD would not interact, so that the electrical output from each element would accurately reflect its optical input. In practice, various types of interactions between the elements can limit the utility of an array. Crosstalk might be expected due to coupling of electromagnetic fields or the generation of phonons during a detection event, so it is important to test whether one detector element firing affects adjacent elements.

Several tests were performed on the two-element SNSPD in order to verify that each element was behaving independently. These tests were performed using a cryogenic probing station setup 50, with two readout channels that included an RF electrical probe, bias T, battery-powered current source, attenuator, amplifier and DC block, as shown in FIG. 2B. The detector was optically illuminated through the sapphire substrate using a focused spot from a fiber-coupled lens assembly, which was also mounted on a micromanipulated arm. The electrical output from each detector element was connected to a 6 GHz real-time oscilloscope or a pulse counter.

The first test performed to characterize the two-element SNSPD was a measurement of the critical current of each detector element. The bias currents in both detector elements were adjusted and the critical current for a given element did not change measurably as the current in the adjacent element was adjusted over the range in which it remained superconducting. When the critical current was exceeded and heat was continually dissipated in one of the nanowires, the critical current of the adjacent nanowire decreased by more than 10%, which we believe was due to local heating. The measurements discussed below were made with both elements in the superconducting state, biased at approximately 95% of their respective critical currents, except where otherwise noted.

Next, the timing jitter of the MESNSPD was measured to determine if interaction between elements might be detrimental to the device timing. An optical input was provided consisting of <1 ps, 1550-nm-wavelength optical pulses generated at a 10 MHz repetition frequency from a passively mode-locked fiber laser. The intensity of these pulses was adjusted such that the probability of obtaining a detection event was roughly 10% for each detector element per optical pulse. An optical splitter was used to direct a portion of the light to a 40

GHz photodiode whose output was also connected to the oscilloscope. The front edge of one detector element's output signal was used to trigger the oscilloscope and the timing of the front edge of the photodiode output was measured. This allowed the timing jitter of each element's output to be measured, as the timing jitter of the photodiode output was negligibly small.

Figure 3A:
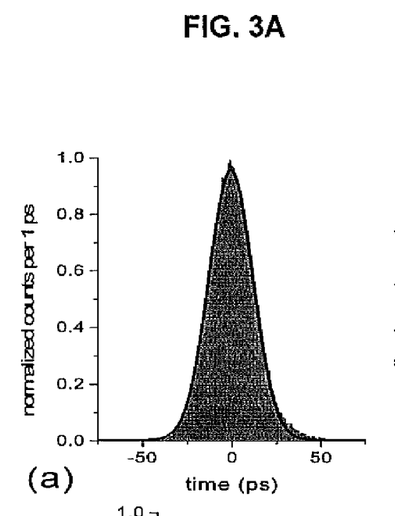
FIGS. 3A-3C are histograms illustrating the timing jitter of each detector element measured relative to the illuminating optical pulse and a Gaussian fit.
Figure 3B:
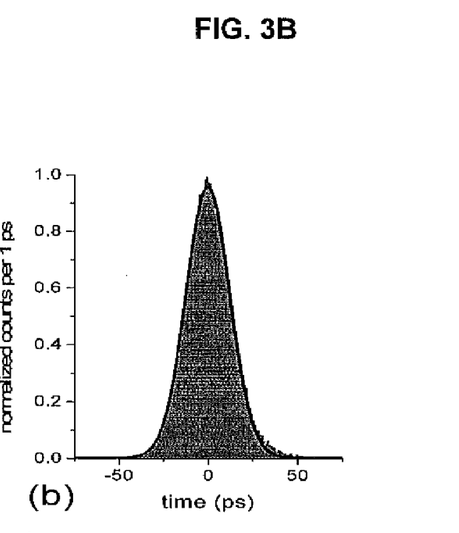
Figure 3C:
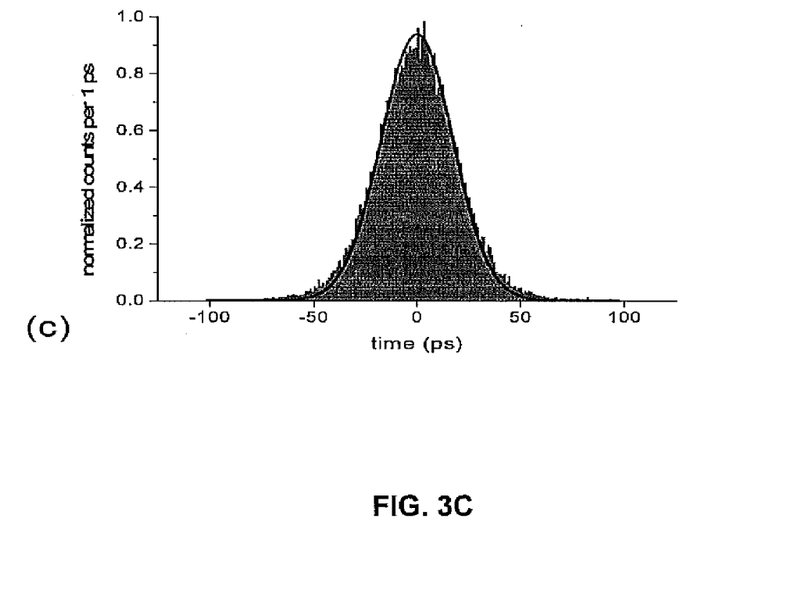

The obtained histograms of FIGS. 3A and 3B show that the two detector elements each have a timing jitter of 29 ps FWHM. Next, the relative timing jitter of the two detector elements was measured. For this measurement, the oscilloscope continued to be triggered by the front edge of one detector element's output while the timing jitter of the front edge of the second element's output signal was measured. The histogram of this relative timing jitter is shown in FIG. 3C. This timing jitter closely matches the prediction based on the convolution of the timing jitter measured for each element independently, confirming that the jitter in each detector element is independent. We believe this measured 44 ps FWHM coincident timing jitter is the best reported for a pair of single photon counting detectors, making the MESNSPD an attractive candidate for Hanbury Brown-Twiss measurements.

The two-element SNSPD was also tested for crosstalk, where a noise count occurs in one element due to a detection event in the adjacent element. In this case, the laser input to the device was blocked and the electrical arrangement was identical to that used to measure the relative timing jitter. The detector elements were illuminated with low-intensity background light that had constant intensity and can be well approximated by Poisson statistics. The background light counts from one detector element were used to trigger the oscilloscope and the number of coincident noise counts from the second element was measured.

The intensity of the background light was adjusted such that the count rate in the second detector was 100 kHz. An output pulse was considered coincident whenever it occurred within a 1 ns time period, centered on the timing of coincident events as determined from the relative timing jitter measurement. After 750,000 detection events in the element used to trigger the measurement, 80 coincident detection events were observed in the adjacent detector element. If the counts in the second detector were uncorrelated to those in the triggering detector, 75 coincident detection events would be expected within 750,000 1 ns time windows. Therefore, the measured crosstalk, 0.0007% (±0.001%), is within the noise of the measurement.

Finally, the detection efficiency of the devices was measured to look for any evidence of an interaction between the device elements. The optical and electrical setup used to measure the detection efficiency was the same as that used to measure the timing jitter except for the way the oscilloscope was triggered. First, only one of the detector elements was biased at various critical currents while the other element was left unbiased. The oscilloscope was triggered using the photodiode output and the detector element's output was connected to another oscilloscope channel. The detection efficiency was measured by comparing the number of detection pulses in a 1 ns time period, centered to capture detection events from the optical pulses, to the total number of trigger events. Second, the adjacent detector element was biased at 95% of its critical current and the oscilloscope was triggered by its output.

Figure 4:
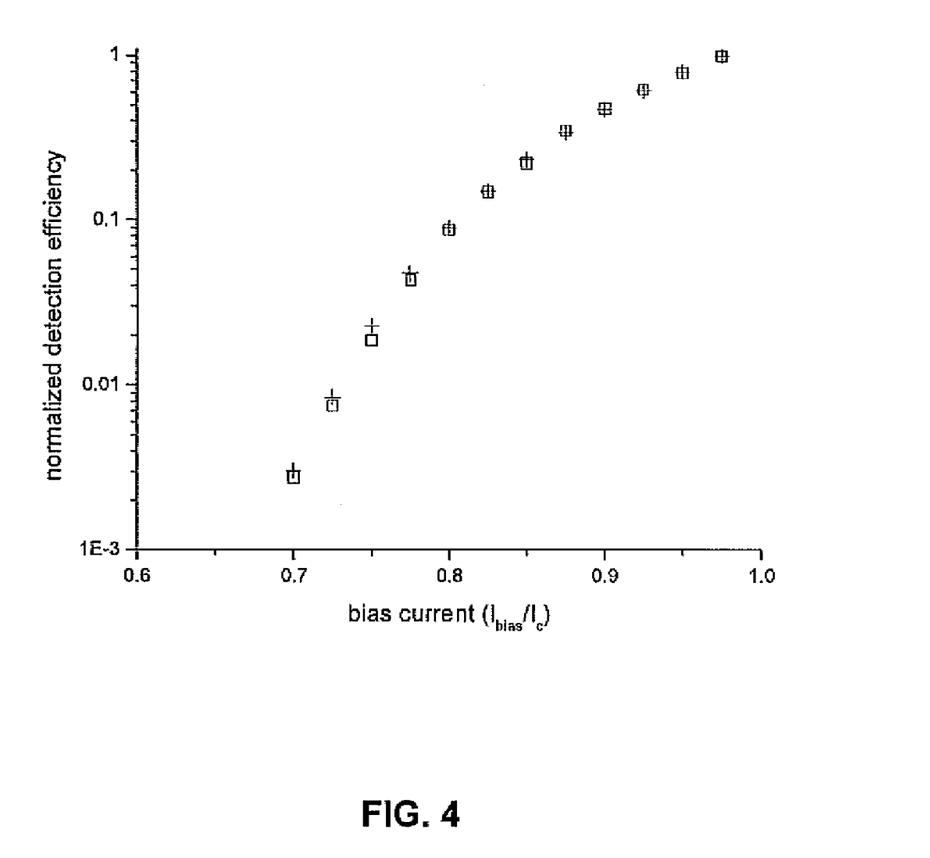
FIG. 4 is a graph illustrating the normalized detection efficiency of a single detector element measured with the adjacent element unbiased and conditioned on the adjacent element.

The detection efficiency of the first detector element was measured by comparing the number of detection pulses in a 1 ns time period to the number of trigger events, which in this case restricted the measurement to only those optical pulses from which a photon was detected by the adjacent element. Thus, the detection efficiency without the adjacent detector element biased can be compared to the detection efficiency conditioned on the adjacent element firing. FIG. 4 shows both of these measured detection efficiencies. There was no statistically significant difference between the detection efficiency measured with and without the adjacent element biased. Therefore, the measurements of the critical current, timing jitter, noise counts and detection efficiency demonstrate that there is no measurable interaction between the adjacent detector elements.

While the MESNSPD provides the opportunity to extract many types of additional information about the input optical photons, as is true for any array of photon counters, this section will instead focus on the performance benefits of a two-element SNSPD. A two-element SNSPD is sufficient to obtain limited photon-number resolution and a higher maximum counting rate by spreading the optical beam evenly across both elements. The fact the MESNSPD provides a continuous optical active area, without gaps between detector elements, permits the optical elements to be smaller than the focused optical spot. In this configuration, a two-element SNSPD can simultaneously resolve two photons. The speed of the MESNSPD is increased in two ways relative to a single SNSPD with the same active area: by a factor of two due to the lower kinetic inductance of each element and by a second factor of two due to the fact there are multiple elements, each counting simultaneously.

First, in order to investigate the two-element SNSPD's ability to resolve multiple photons, we may measure the probability that zero, one, or two elements fire as a function of optical intensity. The optical and electrical setup used to measure these probabilities was the same as that used to measure the timing jitter and detection efficiency, except that the photodiode output was used to trigger the oscilloscope and the number of detection events was extracted by adding the output traces from each detector element after analog-to-digital conversion. Although it is preferable to threshold each output signal separately and digitally add the number of detected photons when a large number of elements are used, the signal to noise ratio of the summed output trace was sufficient to clearly distinguish zero, one and two detection events from the summed analog trace in FIG. 5. The measured probability of detecting zero, one, or two detected photons as a function of optical intensity is shown in FIG. 5.

Figure 5:
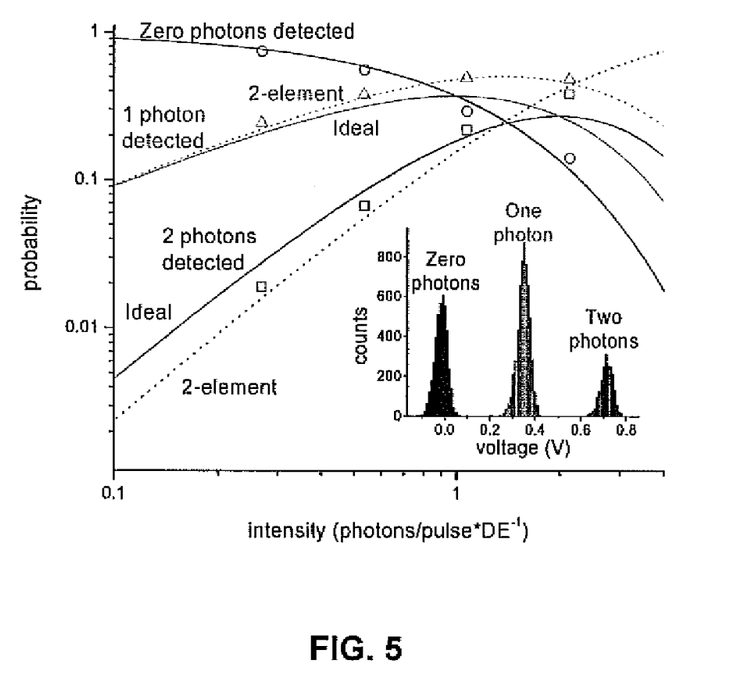
FIG. 5 is a graph illustrating the theoretical probability of detecting zero, one, or two photons as a function of optical intensity using a two-element single-photon detector and an ideal photon-number-resolving detector.

Additionally, two sets of theoretical curves are also shown in FIG. 5: dashed curves showing the expected probabilities for a two element array and solid curves showing the expected probabilities for an ideal photon-number-resolving detector with the same detection efficiency as the two-element SNSPD. It should be noted that coherent optical radiation was used in both the measurements and theoretical curves, so a non-unity detection efficiency shifts the curves without changing their shape.

Although, the detection efficiency plays a crucial role in determining the fidelity with which any photon counter can measure the number of incident photons, FIG. 4 is intended to highlight the penalty associated with using a two-element SNSPD. MESNSPDs with a larger number of elements may be required to reduce this penalty to an acceptable level for some applications, although even the best demonstrated SNSPD detection efficiency will quickly become the dominant limitation to achieving high fidelity. A two-element SNSPD is likely to provide sufficient photon-number-resolving capability to benefit applications such as optical communications and quantum optics, but is not sufficient for linear optics quantum computing.

In addition to the photon-number-resolution, spreading an optical beam across a two-element SNSPD can provide a higher maximum counting rate. This counting rate can be demonstrated by measuring the probability of detecting photons from a second optical pulse as a function of time after detecting the first pulse. Although optical splitters and an optical delay line can be used with the mode-locked fiber laser source to perform this measurement, an alternative approach to generating a train of optical pulse pairs, with a variable relative time delay, was pursued. An externally modulated CW laser was used in which pulses with variable spacing in time were generated by controlling the electrical pattern sent from a pattern generator to a pair of lithium niobate electro-optical modulators.

The generated train of optical pulses measure the recovery time of an SNSPD with the exceptions that the repetition rate was 50 MHz, rather than 10 MHz, and the duration of each optical pulse was ~100 ps, rather than <1 ps. The optical intensity was adjusted such that each detector element had a 13% probability of detecting an optical pulse. In this way, the probability of detecting the second optical pulse was not substantially lower than the probability of detecting the first, regardless of the time between the optical pulses, because the detector element does not fire on the first optical pulse and is thus fully recovered ~87% of the time. The electrical output from each detector element was sent to the oscilloscope and the traces from both element's outputs were saved simultaneously. These traces were post-processed using Matlab in order to determine the marginal and joint probabilities of four events during each optical pulse pair: XY where X=(A, B) identifies the detector element and Y=(1, 2) identifies the first or second optical pulse in a pair. Thus, for a given optical pulse pair, event A1 would denote detector A firing on the first optical pulse.

Using the event probabilities calculated from the recorded oscilloscope traces, we may calculate the detection efficiency as a function of time following a detection event. We first calculate the probability of each detector element independently detecting a photon from the second optical pulse conditioned on measuring a photon from the first optical pulse. Normalizing this probability relative to the probability of detecting the second pulse when the detector is fully recovered, the probability for each detector X is: $P(X2|X1)/P(X2|\sim X1)$.

Figure 6:
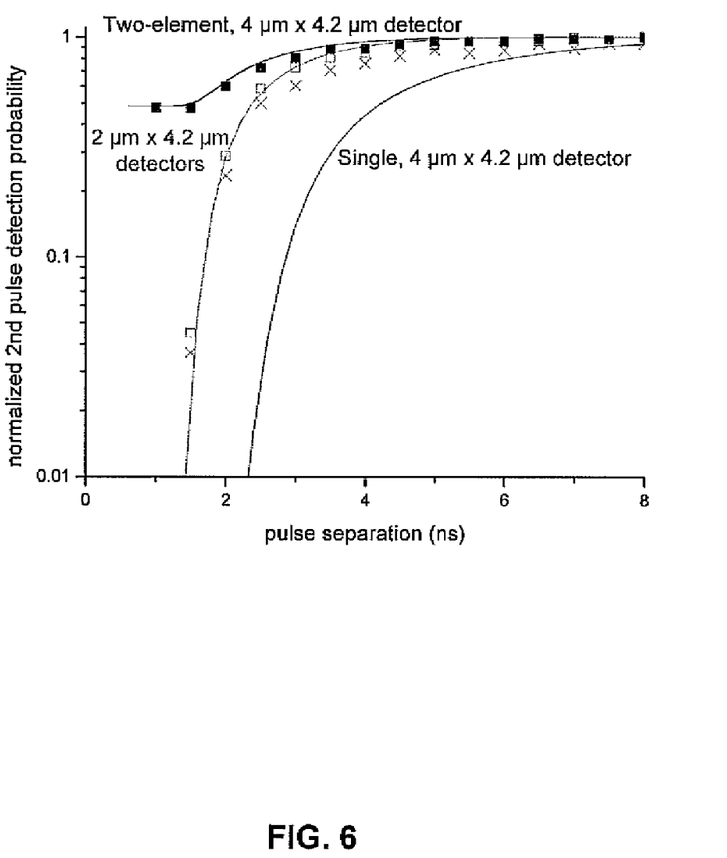
FIG. 6 is a graph illustrating the normalized probability of detecting a photon from a second optical pulse conditioned on the detection of at least one photon from the first optical pulse as a function of the optical pulse separation.

The normalized detection efficiency is calculated by averaging this probability over ~210,000 optical pulse pairs for each value of pulse separation and is shown as a function of the relative time between optical pulses for each of the two detector elements in FIG. 6. It is clearly seen that the probability of detecting both optical pulses with a single detector element becomes negligibly small when the optical pulses are closely spaced in time. However, the two-element detector does not have a negligible probability of detecting photons from two pulses closely spaced in time. The normalized probability of a photon from both optical pulses being detected by any combination of the two detector elements is given by $P(A230\ B2|A1+B1)/P(A2+B2|\sim(A1+B1))$.

The normalized detection efficiencies calculated from this probability for the two-element detector are also shown in FIG. 6 and the detection efficiency is 50% when the two optical pulses are closely spaced in time. This 50% normalized detection efficiency occurs only in the low-flux limit, when it is unlikely that both detector elements will fire on the first optical pulse. If only a single detector fires on the first pulse, the probability of detecting a photon from the second optical pulse is only cut by the probability the second photon is incident on the same, now inactive, element.

The recovery of the detection efficiency following a detection event was also calculated using the measured inductance and detection efficiency versus current. The detection efficiency recovery for the two-element detector, as shown in FIG. 6, is calculated assuming the second detector remains active 87% of the time, and must recover from simultaneously detecting a photon the remaining 13% of the time. The recovery of each element independently is also calculated and shown in FIG. 6. Finally, the detection efficiency recovery of a device with the same active area as the two-element device is calculated by assuming its inductance is the sum of the two individual elements' inductances as shown in FIG. 6, because kinetic inductance dominates and is proportional to length. These curves in FIG. 6 clearly show that the counting rate of the two-element SNSPD is increased relative to a single SNSPD with the same active area both by the fact each element can count independently and due to the fact the kinetic inductance of each element is only half that of the entire nanowire.

The invention provides an approach for fabricating multiple superconducting nanowire single photon detector elements with a single active area. A two-element SNSPD was fabricated and tested, and no measurable crosstalk or interactions were found between operating elements. With appropriately sized elements and suitable input optics, a MESNSPD can provide spatial and spectral information just like other arrays of photon counting detectors, but without the losses associated with coupling to independent elements. Furthermore, the MESNSPD provides the unique benefit of allowing individual elements to be smaller than a diffraction-limited optical spot when the multiple elements are intended for providing photon number resolution or higher speed. The MESNSPD is thus ideally suited to applications that can benefit from high counting rates, precise timing resolution, photon-number resolution and low optical coupling loss such as high-sensitivity classical optical communications and quantum optics, particularly Hanbury Brown-Twiss measurements.

Although the present invention has been shown and described with respect to several preferred embodiments thereof, various changes, omissions and additions to the form and detail thereof, may be made therein, without departing from the spirit and scope of the invention.

What is claimed is:

1. A multi-element optical detector comprising:
   a plurality of optical detector elements capable of producing an output signal having information about the state of an incident electromagnetic radiation as a function of time; and
   an active region comprising a photosensitive region of one of said optical detector elements separated in part or in whole from the photosensitive region of at least one other optical detector element by a distance less than the wavelength of the electromagnetic radiation that the optical detector elements are being used to detect, wherein said optical detector elements are allowed to be operated individually and independently whether or not such electronics are actually in place to individually address the elements.

2. The multi-element optical detector of claim 1, wherein said photosensitive regions are electrically connected through non-photosensitive electrical elements.

3. The multi-element optical detector of claim 2, wherein said non-photosensitive electrical elements comprise wires, resistors, capacitors, junctions, or transistors.

4. The multi-element optical detector of claim 1, wherein said output signal comprises the combined outputs of each of said optical detector elements to provide more information about the detected electromagnetic radiation.

5. The multi-element optical detector of claim 4, wherein said output signal comprises spatial mode, spectral mode, temporal mode, or polarization of the electromagnetic radiation to be detected.

6. The multi-element optical detector of claim 1, wherein said active region is arranged to compose the total active region in any configuration suitable for the intended function.

7. The multi-element optical detector of claim 1, wherein said optical detector elements are not intertwined so as to direct said electromagnetic radiation toward specific optical detector elements in order to extract information about its state.

8. The multi-element optical detector of claim 1, wherein said optical detector elements are intertwined.

9. The multi-element optical detector of claim 1, wherein said optical detector elements are separated using dielectric spacers, reflectors, or microlenses.

10. A method of forming a multi-element optical detector comprising:
   forming a plurality of optical detector elements capable of producing an output signal having information about the state of an incident electromagnetic radiation as a function of time; and
   forming an active region comprising a photosensitive region of one of said optical detector elements separated in part or in whole from the photosensitive region of at least one other optical detector element by a distance less than the wavelength of the electromagnetic radiation that the optical detector elements are being used to detect, wherein said optical detector elements are allowed to be operated individually and independently whether or not such electronics are actually in place to individually address the elements.

11. The method of claim 10, wherein said photosensitive regions are electrically connected through non-photosensitive electrical elements.

12. The method of claim 11, wherein said non-photosensitive electrical elements comprise wires, resistors, capacitors, junctions, or transistors.

13. The method of claim 10, wherein said output signal comprises the combined outputs of each of said optical detector elements to provide more information about the detected electromagnetic radiation.

14. The method of claim 13, wherein said output signal comprises spatial mode, spectral mode, temporal mode, or polarization of the electromagnetic radiation to be detected.

15. The method of claim 10, wherein said active region is arranged to compose the total active region in any configuration suitable for the intended function.

16. The method of claim 10, wherein said optical detector elements are not intertwined so as to direct said electromagnetic radiation toward specific optical detector elements in order to extract information about its state.

17. The method of claim 10, wherein said optical detector elements are intertwined.

18. The method of claim 10, wherein said optical detector elements are separated using dielectric spacers, reflectors, or microlenses.

* * * * *